(12) United States Patent
Huang et al.

(10) Patent No.: US 10,580,789 B2
(45) Date of Patent: Mar. 3, 2020

(54) SEMICONDUCTOR DEVICE HAVING ETCHING CONTROL LAYER IN SUBSTRATE AND METHOD OF FABRICATING THE SAME

(71) Applicant: MACRONIX International Co., Ltd., Hsinchu (TW)

(72) Inventors: Chi-Hao Huang, Hsinchu (TW); Chin-Cheng Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 58 days.

(21) Appl. No.: 15/645,824

(22) Filed: Jul. 10, 2017

(65) Prior Publication Data

US 2019/0013325 A1 Jan. 10, 2019

(51) Int. Cl.
*H01L 27/11578* (2017.01)
*H01L 27/11582* (2017.01)
*H01L 27/11573* (2017.01)
*H01L 21/3065* (2006.01)
*H01L 21/308* (2006.01)
*H01L 21/265* (2006.01)
*H01L 21/762* (2006.01)
*H01L 21/266* (2006.01)
(Continued)

(52) U.S. Cl.
CPC ...... *H01L 27/11578* (2013.01); *H01L 21/266* (2013.01); *H01L 21/26533* (2013.01); *H01L 21/3065* (2013.01); *H01L 21/3086* (2013.01); *H01L 27/11573* (2013.01); *H01L 27/11582* (2013.01); *H01L 21/3081* (2013.01); *H01L 21/30604* (2013.01); *H01L 21/76229* (2013.01); *H01L 21/76237* (2013.01); *H01L 27/10823* (2013.01); *H01L 27/10876* (2013.01); *H01L 2251/105* (2013.01)

(58) Field of Classification Search
CPC .......... H01L 21/26533; H01L 21/266; H01L 21/30604; H01L 21/3065; H01L 21/3081; H01L 21/76229; H01L 21/76232; H01L 21/76235; H01L 21/76237; H01L 27/10823; H01L 27/10876; H01L 2251/105

See application file for complete search history.

(56) References Cited

U.S. PATENT DOCUMENTS 4,571,819 A 2/1986 Rogers et al.
5,654,216 A * 8/1997 Adrian .............. H01L 21/32136
257/E21.311

(Continued)

OTHER PUBLICATIONS

Shin-Hung Chen, et al., "A Highly Scalable 8-layer Vertical Gate 3D NAND with Split-page Bit Line Layout and Efficient Binary-sum MiLC (Minimal Incremental Layer Cost) Staircase Contacts," 2012 IEEE International Electron Devices Meeting (IEDM), Dec. 10-13, 2012, pp. 2.3.1-2.3.4.

(Continued)

*Primary Examiner* — Mohsen Ahmadi
(74) *Attorney, Agent, or Firm* — J.C. Patents

(57) ABSTRACT

A semiconductor device and method of fabricating the same are provided. The semiconductor device includes a substrate having a trench and an etching stop layer. The etching stop layer is disposed in the substrate and surrounds the bottom surface and a portion of a sidewall of the trench.

10 Claims, 14 Drawing Sheets

(51) Int. Cl.
*H01L 21/306* (2006.01)
*H01L 27/108* (2006.01)

(56) References Cited

U.S. PATENT DOCUMENTS

| | | | | |
|---|---|---|---|---|
| 6,800,535 | B1* | 10/2004 | Tsai | H01L 27/1087 |
| | | | | 438/243 |
| 7,968,424 | B2* | 6/2011 | Lin | H01L 21/2652 |
| | | | | 438/433 |
| 8,048,711 | B2* | 11/2011 | Doan | H01L 27/14683 |
| | | | | 257/E33.076 |
| 8,841,183 | B2* | 9/2014 | Ozawa | H01L 21/28282 |
| | | | | 257/E21.21 |
| 8,975,154 | B2* | 3/2015 | Dutartre | H01L 21/76237 |
| | | | | 257/E21.546 |
| 9,305,824 | B2* | 4/2016 | Shinohara | H01L 21/76224 |
| 9,647,022 | B2* | 5/2017 | Hung | H01L 27/1463 |
| 2007/0187734 | A1* | 8/2007 | Adkisson | H01L 27/1463 |
| | | | | 257/293 |
| 2008/0020542 | A1* | 1/2008 | Maynollo | H01L 21/76224 |
| | | | | 438/424 |
| 2008/0057612 | A1* | 3/2008 | Doan | H01L 21/76237 |
| | | | | 438/57 |
| 2008/0265348 | A1* | 10/2008 | Maas | H01L 27/14621 |
| | | | | 257/432 |
| 2008/0308782 | A1* | 12/2008 | Shue | G11C 11/5678 |
| | | | | 257/2 |
| 2010/0006969 | A1* | 1/2010 | Park | H01L 27/14621 |
| | | | | 257/446 |

OTHER PUBLICATIONS

"Office Action of Taiwan Counterpart Application," dated Dec. 29, 2017, p. 1-p. 3, in which the listed reference was cited.

* cited by examiner

SEMICONDUCTOR DEVICE HAVING ETCHING CONTROL LAYER IN SUBSTRATE AND METHOD OF FABRICATING THE SAME

BACKGROUND OF THE INVENTION

1. Technical Field

The invention relates to a semiconductor device and method of fabricating the same.

2. Description of Related Art

With the size of the semiconductor devices gradually reduced, a process of embedding a three dimensional memory into a deep trench of a substrate is developed. However, the uniformity of the trench depth is difficult to control due to the loading effect. The uneven trench depth will result in failure of the wafer acceptance test (WAT) and lead to a decrease in yield.

SUMMARY OF THE INVENTION

The embodiment of the invention provides a method of fabricating a semiconductor device, which can effectively improve the uniformity of the depth of deep trenches.

The embodiment of the invention provides a semiconductor device, including a substrate and an etching stop layer. The substrate has a trench. The etching stop layer is located in the substrate, and surrounds and covers the bottom surface and a portion of sidewalls of the trench.

In some embodiments of the invention, the etching stop layer includes a first doped layer, and a removal rate of the first doped layer is lower than a removal rate of the substrate.

In some embodiments of the invention, the etching stop layer is a multilayer structure and further includes a second doped layer. The second doped layer is disposed in the first doped layer, and a removal rate of the second doped layer is lower than the removal rate of the first doped layer.

In some embodiments of the invention, the second doped layer and the first doped layer include a same dopant, and a dopant concentration of the second doped layer is higher than a dopant concentration of the first doped layer.

In some embodiments of the invention, the second doped layer and the first doped layer include different dopants.

In some embodiments of the invention, the etching stop layer further includes a third doped layer. The third doped layer is disposed in the second doped layer, and a removal rate of the third doped layer is lower than the removal rate of the second doped layer.

In some embodiments of the invention, the third doped layer and the second doped layer include different dopants.

In some embodiments of the invention, the dopant of the etching stop layer includes boron atom, nitrogen atom, carbon atom or a combination thereof.

The invention provides a semiconductor device. The semiconductor device includes a substrate and a doped structure. The substrate has a trench. The doped structure is disposed in the substrate and at two sides of the trench, and at least covers a portion of sidewalls of the trench.

In some embodiments of the invention, a removal rate of the doped structure is higher than a removal rate of the substrate.

In some embodiments of the invention, the doped structure is a multilayer structure including a plurality of doped layers. The plurality of doped layers includes a same dopant, and dopant concentrations of the plurality of doped layers are increased from top to bottom. Removal rates of the plurality of doped layer are increased from top to bottom.

In some embodiments of the invention, the semiconductor device further includes a tree dimensional memory disposed in the trench.

The embodiment of the invention provides a method of fabricating a semiconductor device. A substrate is provided. An etching control layer is then formed in the substrate. The etching control layer and the substrate has different removal rates. Thereafter, a removal process is performed to form a trench in the substrate, and at least a portion of sidewalls of the trench is surrounded by the etching control layer. The removal process is performed by using the one of the etching control layer and the substrate having a lower removal rate as an etching stop layer.

In some embodiments of the invention, the step of forming the etching control layer include forming a first doped layer in the substrate by implanting a dopant into the substrate, so that a removal rate of the first doped layer is lower than the removal rate of the substrate. The removal process is performed with the etching control layer as an etching stop layer, to at least remove a portion of the substrate located on the etching control layer.

In some embodiments of the invention, the step of forming the etching control layer further includes forming a second doped layer in the first doped layer, so that a removal rate of the second doped layer is lower than the removal rate of the first doped layer.

In some embodiments of the invention, the second doped layer and the first doped layer are formed by implanting a same dopant, and a dopant concentration of the second doped layer is higher than a dopant concentration of the first doped layer.

In some embodiments of the invention, the second doped layer and the first doped layer are formed by implanting different dopants.

In some embodiments of the invention, the method further includes forming a third doped layer in the second doped layer, so that a removal rate of the third doped layer is lower than the removal rate of the second doped layer. The third doped layer is formed by implanting a dopant different form the second doped layer.

In some embodiments of the invention, the step of forming the etching control layer includes implanting dopant into the substrate, so that a removal rate of the etching control layer is higher than the removal rate of the substrate. The removal process is performed with the substrate as an etching stop layer, to at least remove the etching control layer.

In some embodiments of the invention, the step of forming the etching control layer includes forming a plurality of doped layers in the substrate. The plurality of doped layers are formed by implanting a same dopant, and dopant concentrations of the plurality of doped layers are increased from top to bottom, so that removal rates of the plurality of doped layers are increased from top to bottom.

Based on above, in the present invention, the etching control layer is formed in the substrate before the trench is formed, thereby controlling the removal rate during the removal process is performed, such that the uniformity of the depth of the trenches is improved.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF THE EMBODIMENTS

Figure 1A:
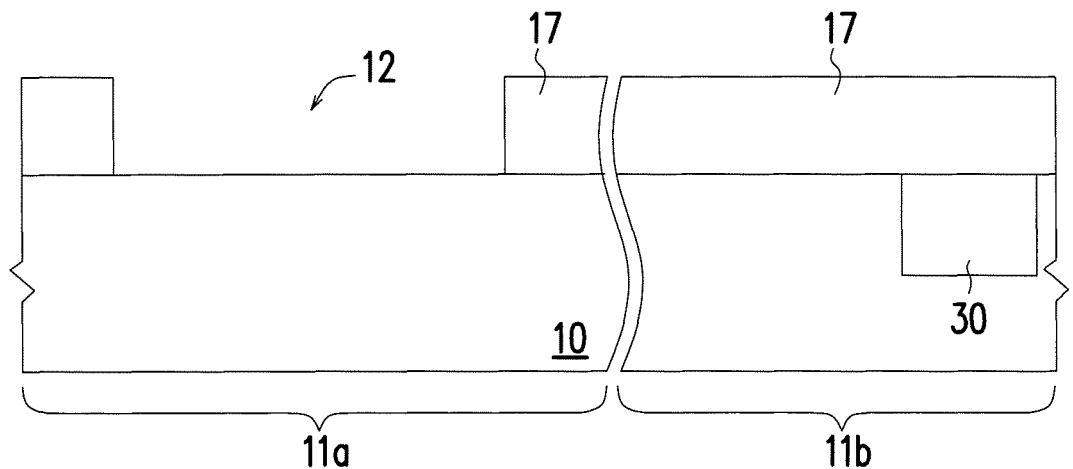
FIG. 1A to FIG. 1F are schematic cross-sectional views illustrating a method of fabricating a semiconductor device according to a first embodiment of the invention.

Reference will now be made in detail to the embodiments of the disclosure, examples of which are illustrated in the accompanying drawings. Wherever possible, the same reference numbers are used in the drawings and the description to refer to the same or like parts.

FIG. 1A to FIG. 1F are schematic cross-sectional views illustrating a method of fabricating a semiconductor device according to a first embodiment of the invention.

Referring to FIG. 1A, a substrate 10 is provided. The substrate 10 is a semiconductor substrate such as a doped silicon substrate, an undoped silicon substrate or a semiconductor on insulator (SOI) substrate. The dopant of the doped silicon substrate may be a p-type dopant, an n-type dopant, or a combination thereof. The substrate 10 has a first region 11a and a second region 11b. In some embodiments, the first region 11a is a memory cell region, and the second region 11b is a peripheral region. A deep well region 30 may be formed in the substrate 10 in the second region 11b. In some exemplary embodiments, the substrate 10 is a p-type silicon substrate and the deep well region 30 is an n-type deep well region. However, the present invention is not limited thereto. In some other exemplary embodiments, the substrate 10 is, for example, an n-type silicon substrate, and the deep well region 30 is, for example, a p-type deep well region. The depth of the deep well region 30 ranges, for example, from 1.5 µm to 2 µm. The deep well region 30 is formed by an ion implantation process, for example.

Still referring to FIG. 1A, a patterned mask layer 17 is then formed on the substrate 10. The patterned mask layer 17 has an opening 12 exposing a portion of the substrate 10 in the first region 11a. The material of the patterned mask layer 17 is photoresist, for example.

Figure 1B:
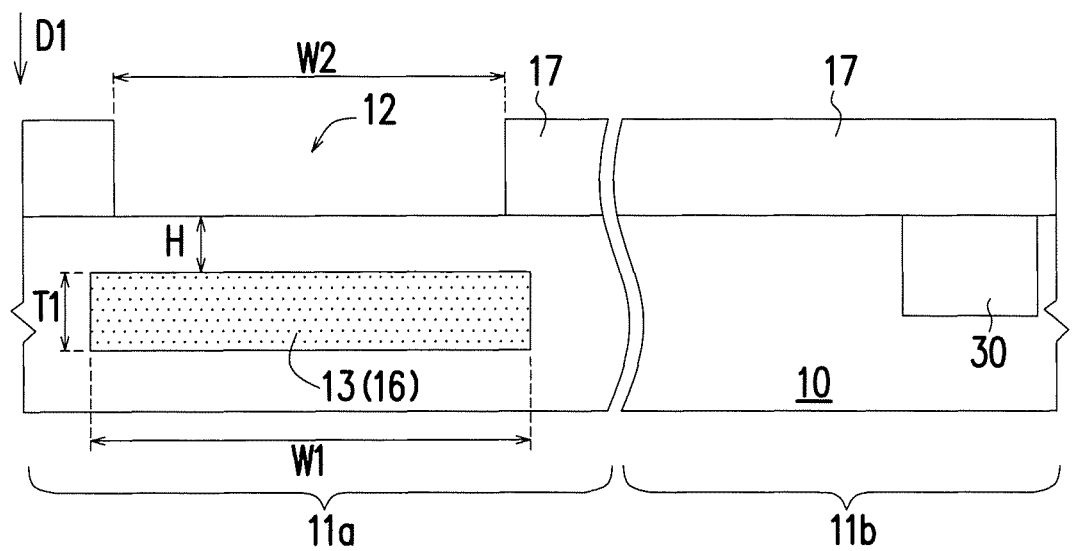

Referring to FIG. 1B, an etching control layer is formed in the substrate 10 in the first region 11a. In some embodiments, the etching control layer is an etching stop layer 16. The etching stop layer 16 may be a single layer or a multilayer structure. In some embodiments, the etching stop layer 16 is a single layer structure including a first doped layer 13. The first doped layer 13 includes a dopant so that the removal rate of the first doped layer 13 is lower than the removal rate of the substrate 10 in the subsequent removal process. In some embodiments, the etching selectivity ratio of the substrate 10 to the first doped layer 13 ranges from 10:1 to 100:1.

Figure 6A:
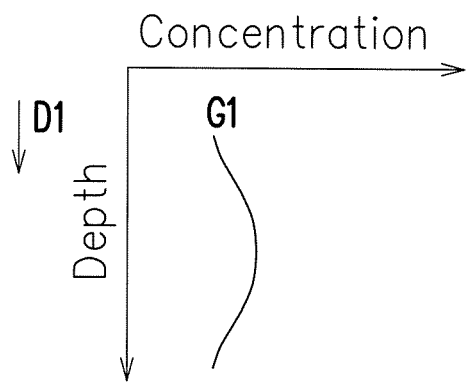
FIG. 6A to FIG. 6B are graphs illustrating the concentration variation of the etching stop layer in FIG. 1B.
Figure 6B:
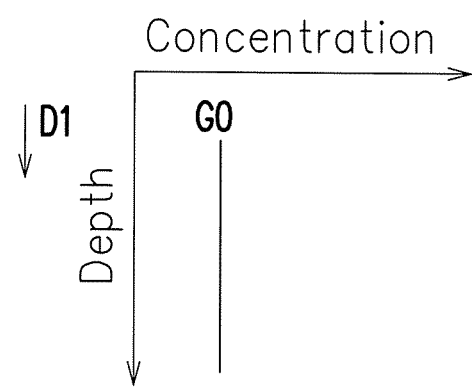

FIG. 6A and FIG. 6B are graphs illustrating the concentration variation of the etching stop layer 16 (the first doped layer 13) in FIG. 1B. Referring to the curve G1 in FIG. 6A, in some embodiments, the dopant concentration of the etching stop layer 16 may be unevenly distributed, for example, Gaussian distributed from top to bottom along the first direction D1. Referring to the curve G0 in FIG. 6B, in some other embodiments, the concentration of the etching stop layer 16 (the first doped layer 13) may be substantially uniformly distributed from top to bottom along the first direction D1. The dopant concentration of the etching stop layer 16 (the first doped layer 13) ranges from $10^{18}$ atom/$cm^3$ to $10^{23}$ atom/$cm^3$.

The method of forming the etching stop layer 16 includes performing a doping process on the substrate 10 exposed by the opening 12 with the patterned mask layer 17 as a mask. The doping process includes an ion implantation process. The etching stop layer 16 may be formed by performing one or more ion implantation processes. In some embodiments, the energy of the ion implantation processes ranges from 1.3 MeV to 3.25 MeV, in some other embodiments, the energy of the ion implantation processes ranges from 1.2 MeV to 1.3 MeV. In some embodiments, a post-implant annealing process is further performed after the ion implantation process, such that the implanted dopants further diffuse.

The dopant implanted by the doping process includes a removal retarding atom such as boron atom, nitrogen atom, carbon atom or a combination thereof. The removal retarding atom means that the atom makes the removal rate of the etching stop layer 16 lower than the removal rate of the substrate 10.

The first doped layer 13 is located in the substrate 10 below the opening 12, since the post-implantation annealing process causes the diffusion of the dopant, the width W1 of the first doped layer 13 is larger than the width W2 of the opening 12. In some exemplary embodiments, the distance H between the top surface of the first doped layer 13 and the top surface of the substrate 10 ranges from 1.7 µm to 2.7 µm. In some other exemplary embodiments, the distance H ranges from 2.7 µm to 3.7 µm. The thickness T1 the first doped layer 13 ranges from 0.02 µm to 0.4 µm, for example.

Figure 1C:
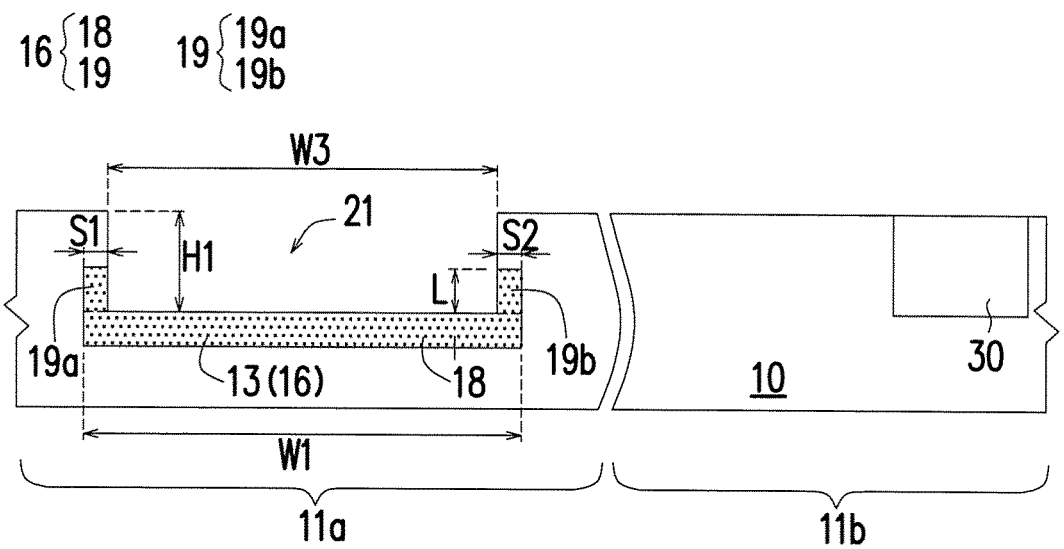

Referring to FIG. 1B and FIG. 1C, a removal process is performed to form a trench 21 with the patterned mask layer 17 as a mask and the first doped layer 13 as the etching stop layer 16. The patterned mask layer 17 is removed thereafter. The removal method includes an etching process such as a dry etching, a wet etching, or a combination thereof. In some embodiments in which the removal method is dry etching, the etching gas used for the etching process is, for example, carbon tetrafluoride ($CF_4$), trifluoromethane ($CHF_3$), sulfur hexafluoride ($SF_6$), or a combination thereof. In some embodiments in which the removal method is wet etching, the etchant used for the etching process is potassium hydroxide (KOH), tetramethylammonium hydroxide (TMAH), ethylene diamine pyrochatecol (EDP) or a combination thereof, for example.

The depth H1 of the trench 21 ranges from 1.7 µm to 3.7 µm, for example, and the width W3 of the trench 21 ranges from 8 mm to 25 mm. In some embodiments, the removal process is stopped in the etching stop layer 16, that is, the substrate 10 exposed by the opening 12 and a portion of the underlying etching stop layer 16 are removed by the removal process.

Still referring to FIG. 1C, a bottom surface and a portion of sidewalls of the trench 21 are surrounded and covered by the etching stop layer 16. Specifically, after the removal process is performed, the etching stop layer 16 includes a bottom part 18 and a protruding prat 19 on the bottom part 18. The protruding prat 19 includes a first protruding prat 19a and a second protruding prat 19b. The first protruding prat 19a and the second protruding prat 19b are located on the two edges of the bottom part 18, respectively. In other words, the trench 21 is located between the first protruding prat 19a and the second protruding prat 19b. The bottom of the trench 21 exposes a portion of the top surface of the bottom part 18, the sidewalls of the trench 21 exposes the first protruding prat 19a, the second protruding prat 19b, and a portion of the substrate 10. The thickness L of the removed etching stop layer 16 is the thickness of the protruding prat 19. In some embodiments, the thickness L of the removed etching stop layer 16 ranges from 0.01 μm to 0.4 μm. The sum value (S1+S2) of the width S1 of the first protruding prat 19a and the width S2 of the second protruding prat 19b substantially equals to the width difference value (W1−W3) between the first doped layer 13 and the trench 21. In some embodiments, the width S1 of the first protruding prat 19a ranges from 0.1 μm to 20 μm. The width S2 of the second protruding prat 19b ranges from 0.1 μm to 20 μm. The width S1 of the first protruding prat 19a and the width S2 of the second protruding prat 19b may be the same or different.

In some other embodiments, the removal process is stopped when the etching stop layer 16 is just exposed (not shown), that is, only a portion of the substrate 10 located on the etching stop layer 16 is removed by the removal process, while the etching stop layer 16 is not removed. In other words, the etching stop layer 16 is almost completely retained. The trench 21 is located on the etching stop layer 16, and the bottom of the trench 21 exposes a portion of the top surface of the etching stop layer 16, and the sidewalls of the trench 21 only exposes the substrate 10.

Figure 1D:
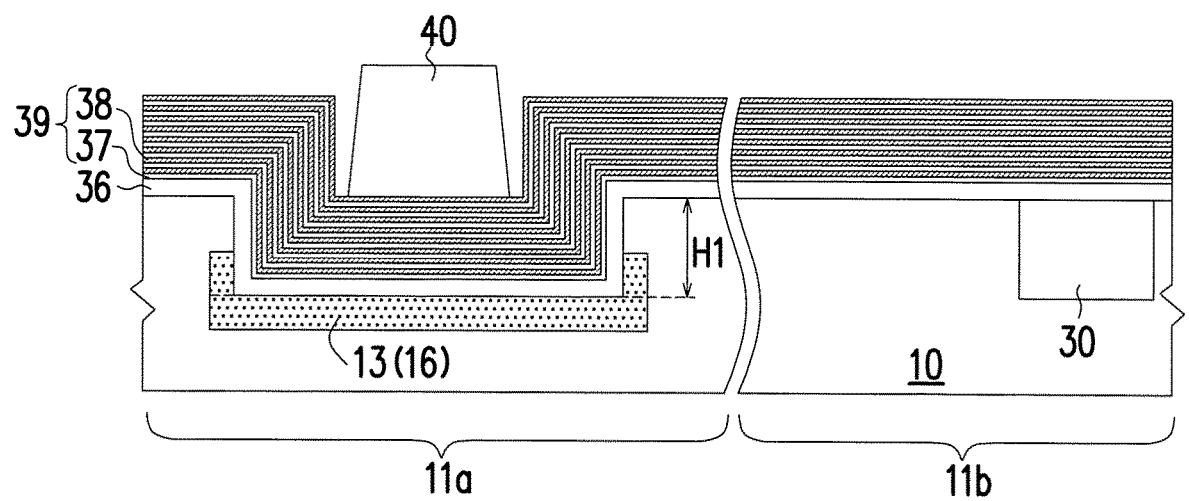

Referring to FIG. 1D, a dielectric layer 36 is formed on the substrate 10. The dielectric layer 36 is filled into the trench 21, and covers the bottom surface and the sidewalls of the trench 21 and the top surface of the substrate 10. The material of the dielectric layer 36 is, for example, silicon oxide, silicon nitride, silicon oxynitride, a low dielectric constant material having a dielectric constant of less than 4, or a combination thereof. In some embodiments, the dielectric layer 36 is a bottom oxide layer (BOX), for example. The thickness of the dielectric layer 36 ranges from 500 angstroms to 3000 angstroms, for example. The method of forming the dielectric layer 36 is, for example, a thermal oxidation method, a chemical vapor deposition method or a combination thereof. Thereafter, a stacked structure material layer 39 is formed on the dielectric layer 36. The stacked structure material layer 39 is filled into the trench 21 and covers the top surface of the substrate 10. In some embodiments, the stacked structure material layer 39 includes a plurality of insulating material layers 37 and a plurality of semiconducting material layers 38 alternately stacked with each other. The number of the stacked structure material layer 39 can be adjusted as required. In some embodiments, the number of layers of the stacked structure material layer 39 is, for example, 19 layers, 32 layers, or any other numbers as needed. The insulating material layer 37 may be a dielectric material such as silicon oxide, silicon nitride, silicon oxynitride, a low dielectric constant material having a dielectric constant of less than 4, or a combination thereof. The material of the semiconducting material layer 38 is undoped polysilicon or doped polysilicon, for example. The forming method of the stacked structure material layer 39 is, for example, a chemical vapor deposition method.

Still referring to FIG. 1D, a patterned mask layer 40 is then formed over the substrate 10 in the first region 11a to cover a portion of the stacked structure material layer 39 within the trench 21. The patterned mask layer 40 is a photoresist, for example.

Figure 1E:
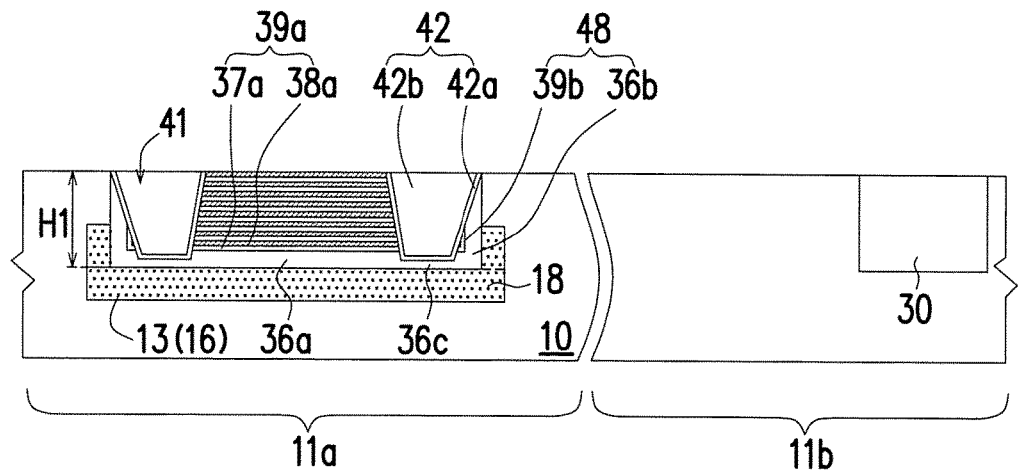

Referring to FIG. 1D and FIG. 1E, a portion of the stacked structure material layer 39 not covered by the patterned mask layer 40 and the underlying dielectric layer 36 are removed by etching with the patterned mask layer 40 as a mask, for example. Thereafter, the patterned mask layer 40 is removed.

In some embodiments, after the foregoing process is performed, a stacked structure 39a, a stacked structure 39b, a dielectric layer 36a, a dielectric layer 36b, and a gap 41 are formed in the trench 21. The stacked structure 39b and the dielectric layer 36b form a spacer 48. The stacked structure 39a is located in the trench 21 and covers a portion of the top surface of the bottom part 18 of the etching stop layer 16. The stacked structure 39a includes a plurality of insulating layers 37a and a plurality of semiconducting layers 38a stacked alternately. The thickness of the insulating layer 37a is, for example, but not limited to, 200 angstroms to 500 angstroms. Each insulating layer 37a may have a same or different thickness. The thickness of the semiconducting layer 38a is, for example, but not limited to, 200 angstroms to 500 angstroms, and each semiconducting layer 38a may have a same or different thickness. The thicknesses and numbers of layers of the insulating layers 37a and the semiconducting layers 38a are not limited by the said descriptions and the drawings, and can be adjusted upon the actual requirements. The top surface of the stacked structure 39a is substantially level with the top surface of the substrate 10. In some embodiments, a cap layer (not shown) may optionally further be formed on the top surface of the stacked structure 39a. The cap layer may be a single layer or a multilayer structure. The material of the cap layer may be a dielectric material such as silicon oxide, silicon nitride, silicon oxynitride, or a combination thereof. In some embodiments, the material of the cap layer is different from the material of the insulating layer 37a, and the thickness of the cap layer is greater than that of the insulating layer 37a. The forming method of the cap layer is, for example, a chemical vapor deposition method.

Still referring to FIG. 1E, the spacer 48 is located at the two sides of the stacked structure 39a and covers the sidewalls of the trench 21. The gap 41 is located between the spacer 48 and the stack structure 39a. In some embodiments, the cross-section of the shape of the gap 41 is an inverted trapezoid, an inverted triangle, a vase shaped, or a combination thereof. In some embodiments, the bottom of the gap 41 exposes a portion of the top surface of the bottom part 18 of the etching stop layer 16 (not shown).

In some other embodiments, after the foregoing process is performed, besides the stacked structure 39a, the spacer 48, the dielectric layer 36a, and the gap 41 are formed in the trench 21, a dielectric layer 36c is also remained at the bottom of the gap 41.

Still referring to FIG. 1E, a dielectric structure 42 is formed in the gap 41. The dielectric structure 42 may be a single layer structure or a multilayer structure. The material of the dielectric structure 42 is, for example, silicon oxide, silicon nitride, silicon oxynitride, or a combination thereof.

In some embodiments, the dielectric structure 42 is a two-layer structure comprising a dielectric layer 42a and a dielectric layer 42b. The top surface of the dielectric structure 42 is substantially level with the top surface of the stacked structure 39a and the top surface of the substrate 10.

Figure 1F:
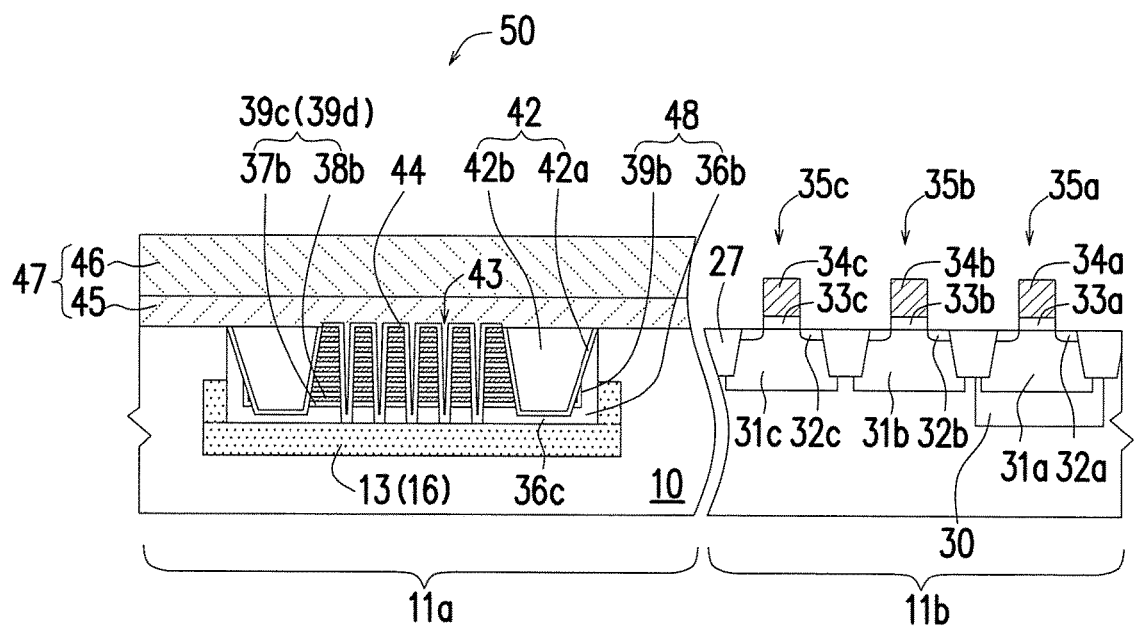

Referring to FIG. 1F, subsequent processes are performed on the first region 11a and the second region 11b of the substrate 10, to form a three dimensional memory 50 in the first region 11a and MOS devices 35a/35b/35c in the second region 11b. The three dimensional (3D) memory 50 includes a flash memory such as a NAND flash memory or a NOR flash memory. The details are described as below.

Referring to FIG. 1F, the stacked structure 39a is patterned to form a patterned stacked structure 39c. The patterned stacked structure 39c includes a plurality of insulating layers 37b and a plurality of semiconducting layers 38b alternately stacked. The patterning method includes lithography and etching processes. In some embodiments, the patterned stacked structure 39c is comb shaped and includes a plurality of stacked patterns 39d having a plurality of trenches 43 therebetween. The trench 43 exposes a portion of the etching stop layer 16 or the dielectric layer 36c. The shape of the cross-section of the trench 43 may be any shape such as a V-shaped, a U-shaped, a rhombus or a combination thereof, but the invention is not limited thereto.

Still referring to FIG. 1F, a charge storage layer 44 is then formed to cover the top surface and sidewalls of the patterned stacked structure 39c and the bottom surface of the trench 43. The material of the charge storage layer 44 includes a dielectric material such as silicon nitride, silicon oxide, or a combination thereof. The charge storage layer 44 may be a single layer or a multilayer structure. In some embodiments, the charge storage layer 44 is a single layer of silicon oxide layer or a single layer of silicon nitride layer, for example. In some other embodiments, the charge storage layer 44 includes a stacked structure of a silicon oxide layer, a silicon nitride layer, and a silicon oxide layer (ONO). The thickness of the charge storage layer 44 is, for example, between 100 angstroms and 400 angstroms. The method of forming the charge storage layer 44 is, for example, a chemical vapor deposition method.

Thereafter, a conducting structure 47 is formed on the charge storage layer 44. The conducting structure 47 may be a single layer or a multilayer structure. In some embodiments, the conducting structure 47 is a two-layer structure including a first conducting layer 45 and a second conducting layer 46. In some embodiments, the first conducting layer 45 is filled into the trenches 43 and covers the top surface of the substrate 10 in the first region 11a. The material of the first conducting layer 45 is, for example, undoped polysilicon or doped polysilicon. The method of forming the first conducting layer 45 is, for example, a chemical vapor deposition method. The second conducting layer 46 is aimed on the first conducting layer 45. The material of the second conducting layer 46 includes a metal, a metal alloy, a metal silicide, or a combination thereof. The metal or metal alloy is, for example, copper, aluminum, tungsten or an alloy thereof. The metal silicide is, for example, tungsten silicide. The method of forming the second conducting layer 46 is a chemical vapor deposition method or a physical vapor deposition method, for example.

The three-dimensional memory 50 including a patterned stacked structure 39c, a charge storage layer 44, and a conducting structure 47 is thus completed. In some embodiments, the conducting structure 47 serves as a word line of the three dimensional memory 50. The semiconducting layers 38b of the patterned stacked structure 39c serves as a bit line of the three dimensional memory 50. Therefore, the patterned stacked structure 39c is also referred to as a bit line stacked structure. In some other embodiments, the conducting structure 47 serves as a bit line of the three dimensional memory 50, and the semiconducting layers 38b of the patterned stacked structure 39c serves as a word line of the three dimensional memory 50.

Still referring to FIG. 1F, a first well region 31a, a second well region 31b, and a third well region 31c are formed in the substrate 10 in the second region 11b. In some embodiments, the first well region 31a is formed in the deep well region 30. The depth of the first well region 31a, the second well region 31b, and the third well region 31c are ranged from 100 angstroms to 20000 angstroms. In some embodiments in which the deep well region 30 is an n-type well, and the first well region 31a is a p-type well, the second well 31b is an n-type well and the third well 31c is a p-type well. The first well region 31a, the second well region 31b, and the third well region 31c may be formed by separate or simultaneous ion implantation processes.

An isolation structure 27 is then formed between the well regions 31a/31b/31c by a shallow trench isolation method, for example. Thereafter, a first MOS device 35a is formed in the first well region 31a, a second MOS device 35b is formed in the second well region 31b, and a third MOS device 35c is formed in the third well region 31c. The first MOS device 35a includes a gate dielectric layer 33a, a conductor layer 34a, and source and drain regions 32a. The second MOS device 35b includes a gate dielectric layer 33b, a conductor layer 34b, and source and drain regions 32b. The third MOS device 35c includes a gate dielectric layer 33c, a conductor layer 34c, and source and drain regions 32c. In the embodiment in which the deep well area 30 is an n-type well region, the first well region 31a is a p-type well region, the second well region 31b is an n-type well region, and the third well region 31c is a p-type well region, the first MOS device 35a, the second MOS device 35b, and the third MOS device 35c are NMOS, PMOS, and NMOS devices, respectively.

Still referring to FIG. 1F, the processes of forming the three dimensional memory 50 in the first region 11a and the processes of forming the components in the second region 11b may be performed simultaneously or separately. Thereafter, the three dimensional memory 50 in the first region 11a and the components in the second region 11b may be electrically connected by a metal interconnection, and subsequent processes may be performed.

In the first embodiment, since the etching stop layer 16 is doped with removal retarding atom, such that a high etching selectivity ratio exists between the substrate 10 to the etching stop layer 16 when the removal process is performed to form the trench 21. Therefore, when the removal rate of different regions of a wafer is not uniform, the etching stop layer 16 formed in the substrate 10 may help to improve the removal uniformity in different regions of the wafer. In other words, the loading effect is reduced; therefore, the uniformity of the depth of the trenches formed in the wafer is improved.

FIG. 2A to FIG. 2E are cross-sectional views illustrating a method of fabricating a semiconductor device according to a second embodiment of the invention. The present embodiment differs from the first embodiment in that the etching stop layer 116 is a two-layer structure including a first doped layer 13 and a second doped layer 14.

Figure 2A:
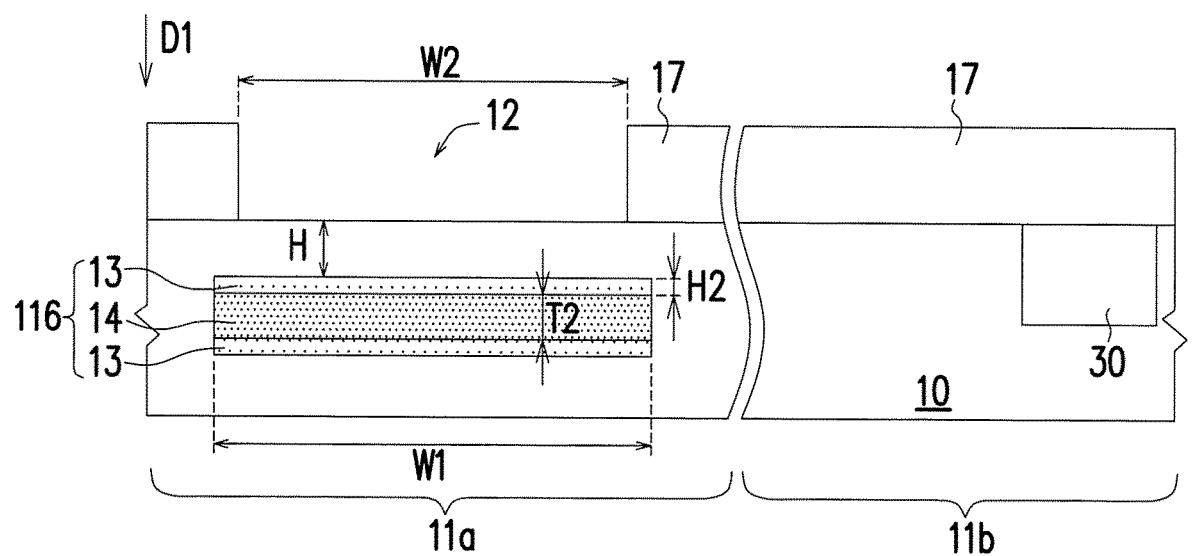
FIG. 2A to FIG. 2E are schematic cross-sectional views illustrating a method of fabricating a semiconductor device according to a second embodiment of the invention.

Referring to FIG. 1B and FIG. 2A, after a first doped layer 13 is formed in the substrate 10 by a first doping process (FIG. 1B), a second doping process, with the patterned mask layer 17 as a mask, is performed on the first doped layer 13 at the corresponding position below the opening 12, to form a second doped layer 14 in the first doped layer 13. The first doped layer 13 and the second doped layer 14 together form the etching stop layer 116. The second doped layer 14 is located in the first doped layer 13, and the height difference H2 between the top surface of the first doped layer 13 and the top surface of the second doped layer 14 ranges from 0.01 µm to 0.2 µm. The thickness T2 of the second doped layer 14 ranges from 0.02 µm to 0.39 µm.

The first doping process and the second doping process may be continuous or discontinuous ion implantation processes with different conditions. The dopant used in the second doping process is a removal retarding atom. In some embodiments, the dopant used in the second doping process is the same as the dopant used in the first doping process, and the concentration of the dopant of the second doped layer 14 is higher than that of the first doped layer 13. In some embodiments, the dopant concentration of the etching stop layer 116 changes from a lower concentration in the first doped layer 13 to a higher concentration in the second doped layer 14, and then from a higher concentration in the second doped layer 14 to a lower concentration in the first doped layer 13 along the first direction D1.

Figure 7:
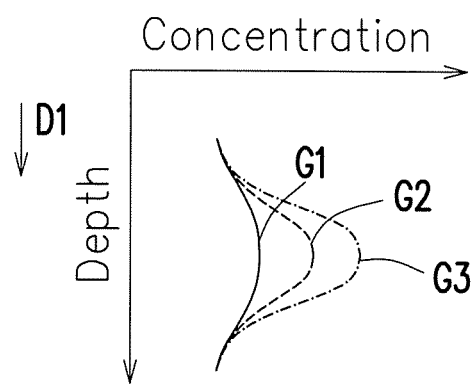
FIG. 7 is a graph illustrating the concentration variation of the etching stop layer in FIG. 2A.

FIG. 7 is a graph illustrating the concentration variation of the etching stop layer 116 in FIG. 2A. Referring to FIG. 7, in some exemplary embodiments, the concentration variation curves of the dopant used in the first doping process and the second doping process are shown as the curve G1 and G2, respectively. The overall concentration variation of the etching stop layer 116 is shown as the curve G3. Curve G1, curve G2 and curve G3 are Gaussian distributed, and peak values and the kurtosis coefficients of the curves G1, Curves G2 and Curves G3 are sequentially increased. The peak value of curve G3 substantially equals to the sum of the peak value of curve G1 and curve G2.

Since the dopant of the etching stop layer 116 is a removal retarding atom, therefore, the higher the dopant concentration, the lower the removal rate. In other words, in the subsequent removal process, the removal rate of the second doped layer 14 is lower than that of the first doped layer 13.

In some embodiments, the dopants used in the first and the second doping process are different, such that the removal rate of the second doped layer 14 is lower than that of the first doped layer 13, that is, the removal rate of the intermediate position of the etching stop layer 116 is lower than that of the upper and lower sides thereof. In some exemplary embodiments, the dopant of the first doped region 13 is boron or nitrogen, for example; the dopant of the second doped region 14 is carbon, for example.

Figure 2B:
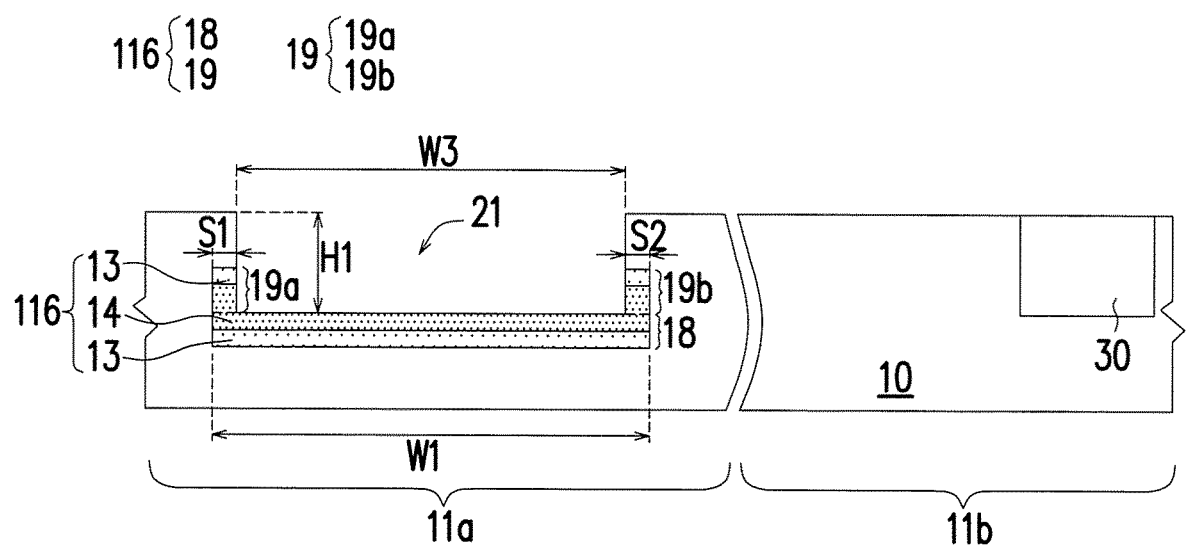

Referring to FIG. 2A and FIG. 2B, a removal process is performed to form a trench 21 in the substrate 10 exposed by the opening 12 with the patterned mask layer 17 as a mask and the first doped layer 13 and the second doped layer 14 as the etching stop layer 116. The patterned mask layer 17 is removed thereafter. In some embodiments, the removal process is stopped at the second doped layer 14 of the etching stop layer 116, that is, the substrate 10 exposed by the opening 12 and a portion of the first doped layer 13 and a portion of the doped layer 14 are removed by the removal process, but the invention is not limited thereto. The removal process may be stopped when the etching stop layer 116 just exposed or at any position of the etching stop layer 116.

Referring to FIG. 2B, after the removal process, the etching stop layer 116 includes a bottom part 18 and a protruding part 19 including a first protruding part 19a and a second protruding part 19b. The structural features of the bottom part 18 and the protruding part 19 of the etching stop layer 116 and their positional relationship with the trench 21 are similar to those of the first embodiment, which will not be described again. Unlike the first embodiment, the bottom part 18 and the protruding part 19 of the present embodiment may respectively be a single layer structure or a multilayer structure depending on the position where the removal process is stopped.

Figure 2C:
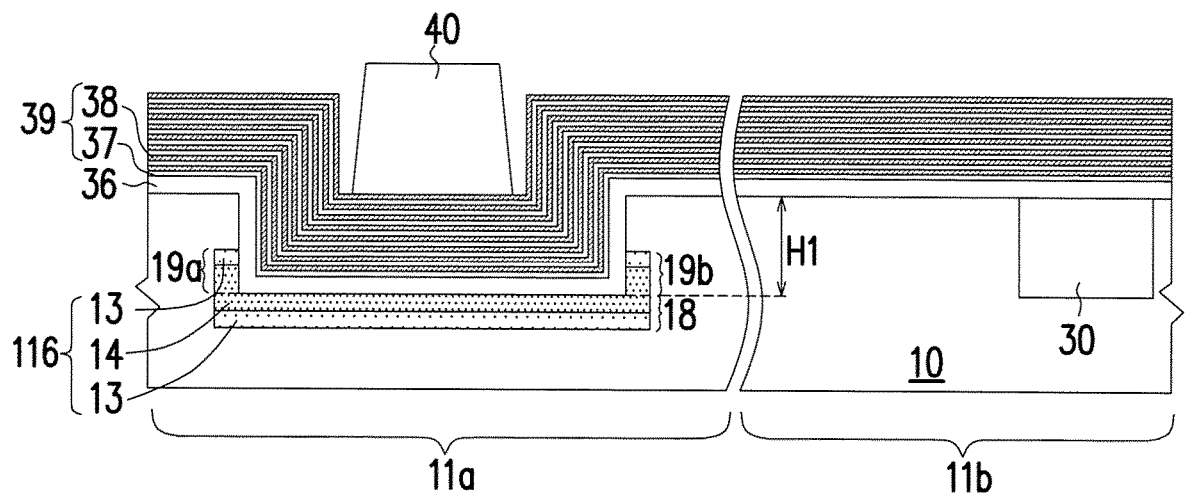
Figure 2D:
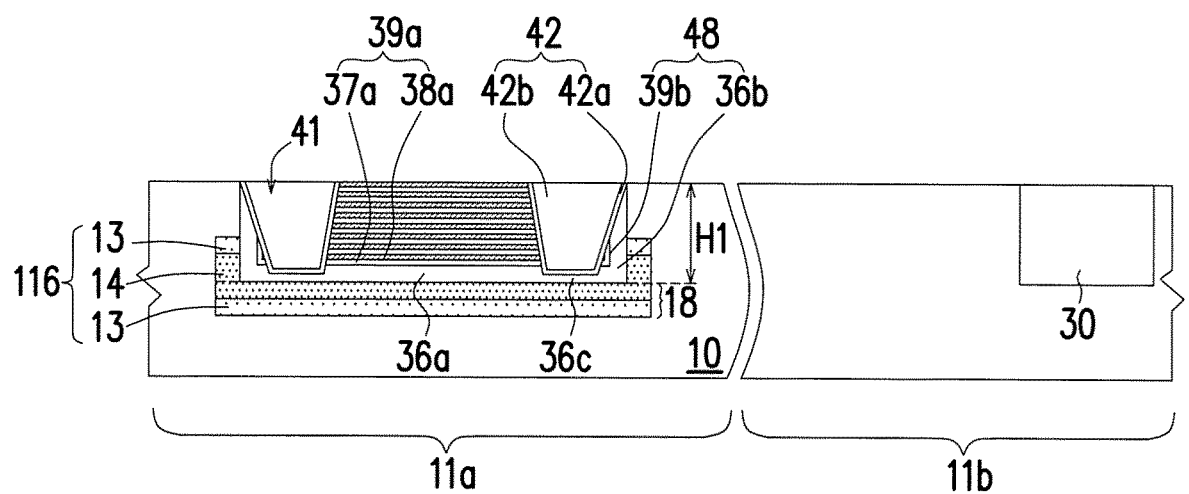
Figure 2E:
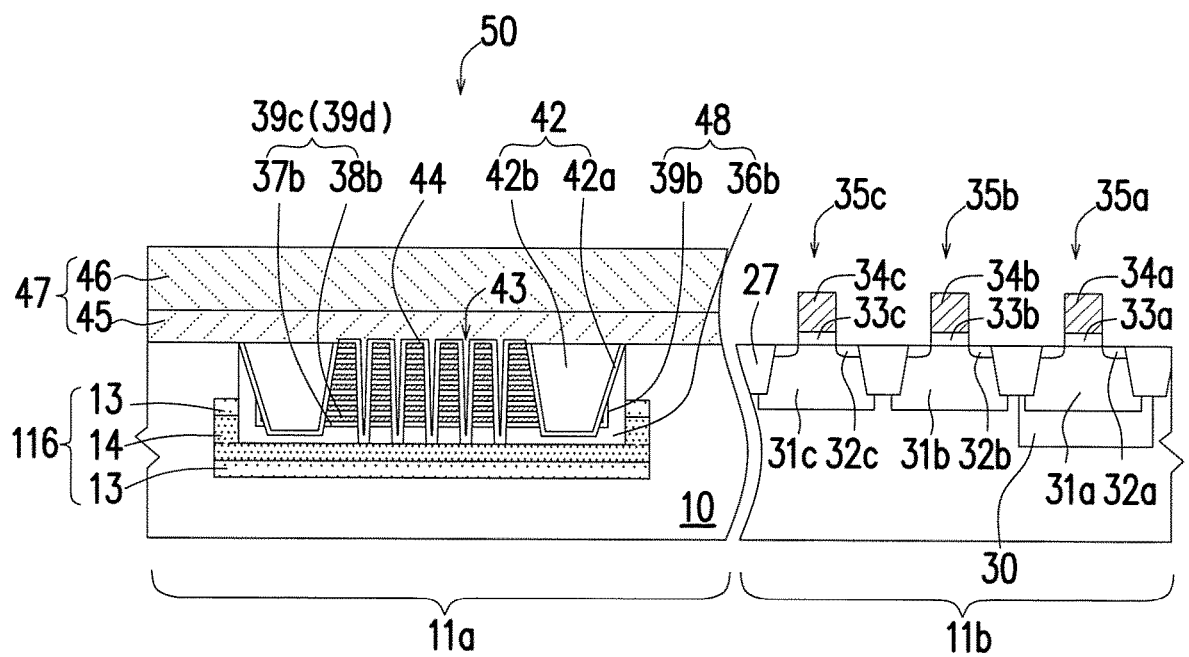

Referring to FIG. 2C to FIG. 2E, processes similar to those of the first embodiment are performed, such that a three dimensional memory 50 is formed in the first region 11a, well regions 31a/31b/31c are formed in the second region 11b, and MOS devices 35a/35b/35c are formed in the well regions 31a/31b/31c, respectively.

FIG. 3A to FIG. 3E are schematic cross-sectional views illustrating a method of fabricating a semiconductor device according to a third embodiment of the invention. The present embodiment differs from the foregoing embodiments in that the etching stop layer 216 is a three-layer structure including a first doped layer 13, a second doped layer 14, and a third doped layer 15.

Figure 3A:
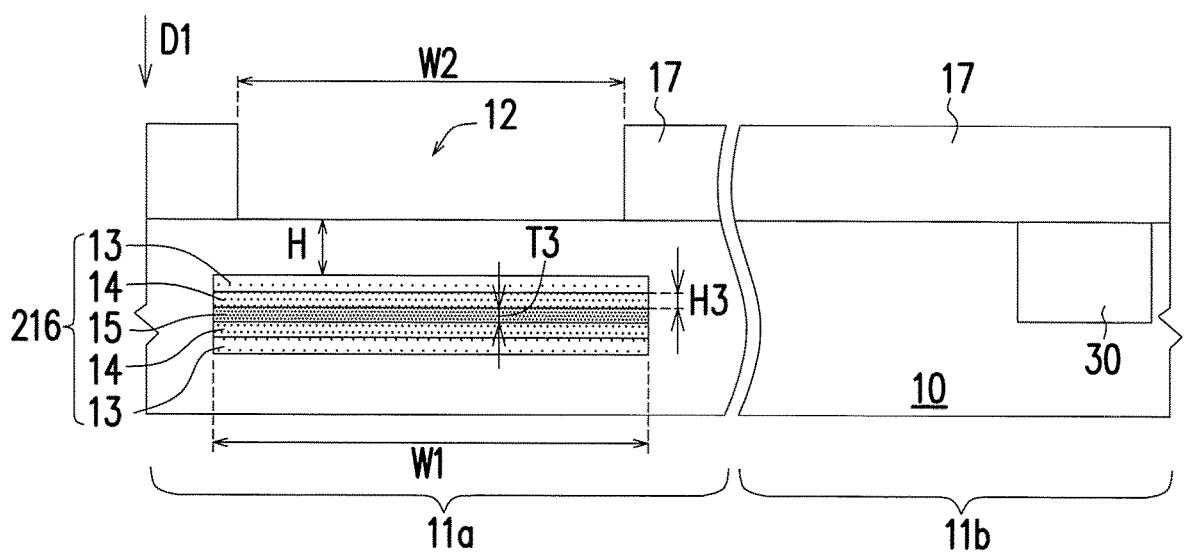
FIG. 3A to FIG. 3E are schematic cross-sectional views illustrating a method of fabricating a semiconductor device according to a third embodiment of the invention.

Referring to FIG. 2A and FIG. 3A, after the second doped layer 14 is formed in the first doped layer 13 in FIG. 2A, a third doping process, with the patterned mask layer 17 as a mask, is performed on the second doped layer 14 so as to form a third doped layer 15 in the second doped layer 14. The first doped layer 13, the second doped layer 14, and the third doped layer 15 together form an etching stop layer 216. The third doped layer 15 is located in the second doped layer 14. In some embodiments, the height difference H3 between the top surface of the third doped layer 15 and the top surface of the second doped layer 14 ranges from 0.01 µm to 0.2 µm. The thickness T3 of the third doped layer 15 ranges from 0.02 µm to 0.38 µm.

The first, the second and the third doping processes may be continuous or discontinuous ion implantation processes with different conditions. In some embodiments in which the first doped layer 13 and the second doped layer 14 includes the same dopant and the dopant concentration of the second doped layer 14 is higher than that of the first doped layer 13, the third doped layer 15 includes a dopant that is different from that of the first doped layer 13 and the second doped layer 14, such that the removal rate of the third doped layer 15 is lower than the removal rate of the second doped layer 14. In some exemplary embodiments, the dopant of the first doped layer 13 and the second doped layer 14 is, for example, boron or nitrogen; and the dopant of the third doped layer 15 is carbon, for example. In some other embodiments, the first doped layer 13, the second doped layer 14, and the third doped layer 15 includes a same dopant, and the dopant concentration of the third doped layer 15 is higher than that of the second doped layer 14, such that the removal rate of the third doped layer 15 is lower than that of the second doped layer 14. It is to be noted that the above described are just examples of different concentrations or different dopants of each doped layer, but the invention is not limited thereto. The dopant type and the dopant concentration of each dopant layer can be adjusted, as long as the removal rates of the first doped layer 13, the second doped layer 14, and the third doped layer 15 are sequentially reduced. In other words, the removal rate of the etching stop layer 216 is firstly reduced and then increased from top to bottom along the first direction D1, that is, the removal rate of the dopant layer located at the intermediate position (from top to bottom) of the etching stop layer 216 is the lowest.

Figure 3B:
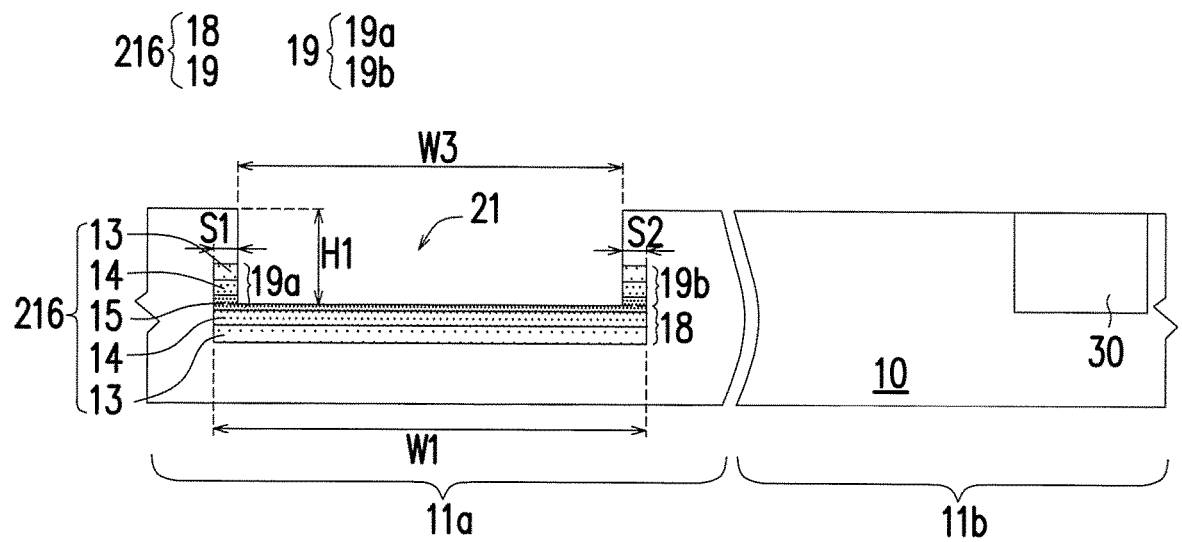

Referring to FIG. 3B, a removal process is performed to form a trench 21 with the patterned mask layer 17 as a mask and the first doped layer 13, the second doped layer 14, and the third doped layer 15 as the etching stop layer 216. The removal process may be stopped when the etching stop layer 216 just exposed, or at any layer of the etching stop layer 216.

Still referring to FIG. 3B, in some embodiments in which the removal process is stopped in the etching stop layer 216, after the removal process, the etching stop layer 216 includes a bottom part 18 and a protruding part 19 including a first protruding part 19a and a second protruding part 19b. The structural features of the bottom part 18 and the protruding part 19 and their positional relationship with the trench 21 are similar to those of the foregoing embodiments, which will not be described again. The bottom part 18 and the protruding part 19 of the present embodiment may respectively be a single layer structure or a multilayer structure depending on the position where the removal process is stopped.

Figure 3C:
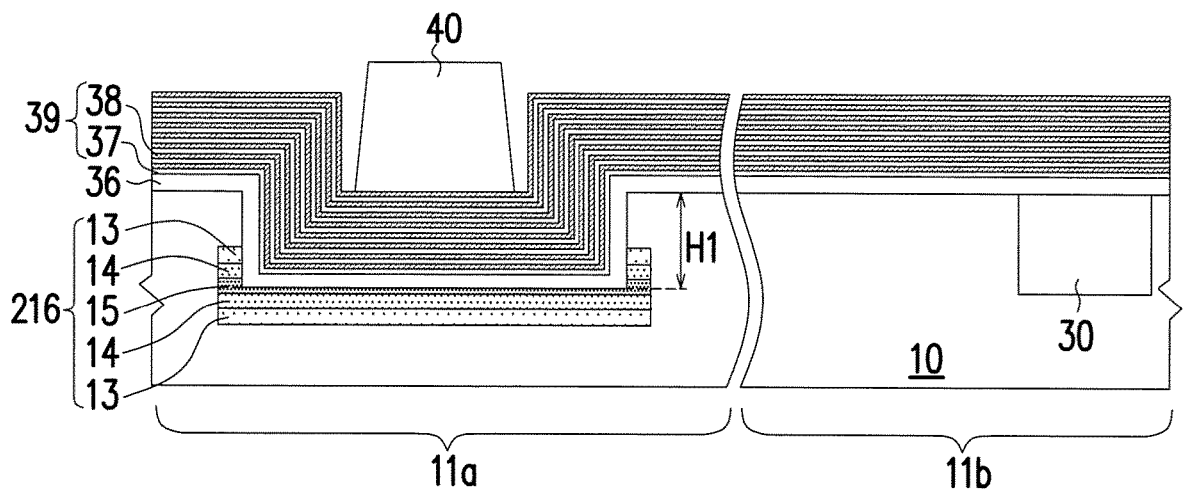
Figure 3D:
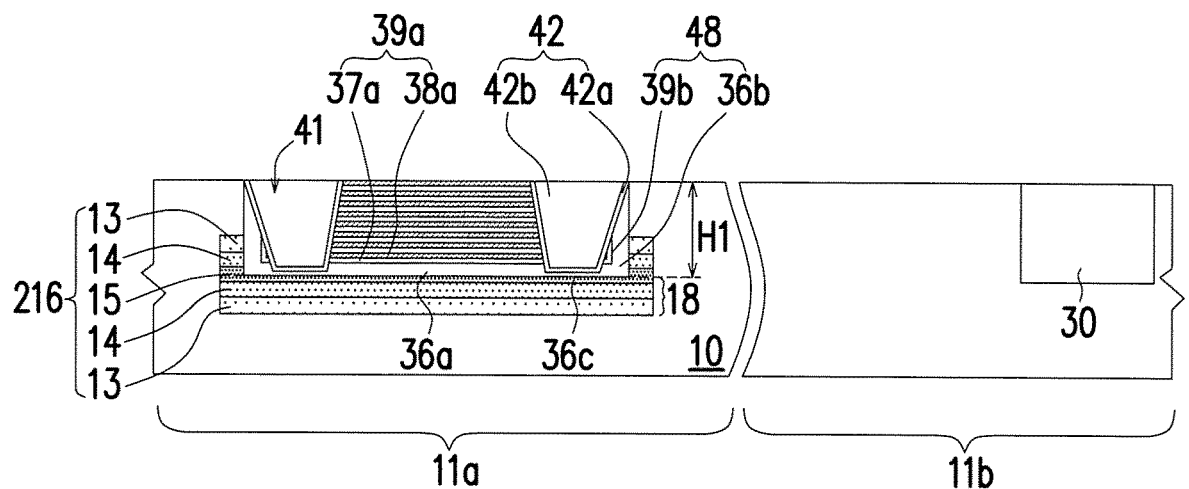
Figure 3E:
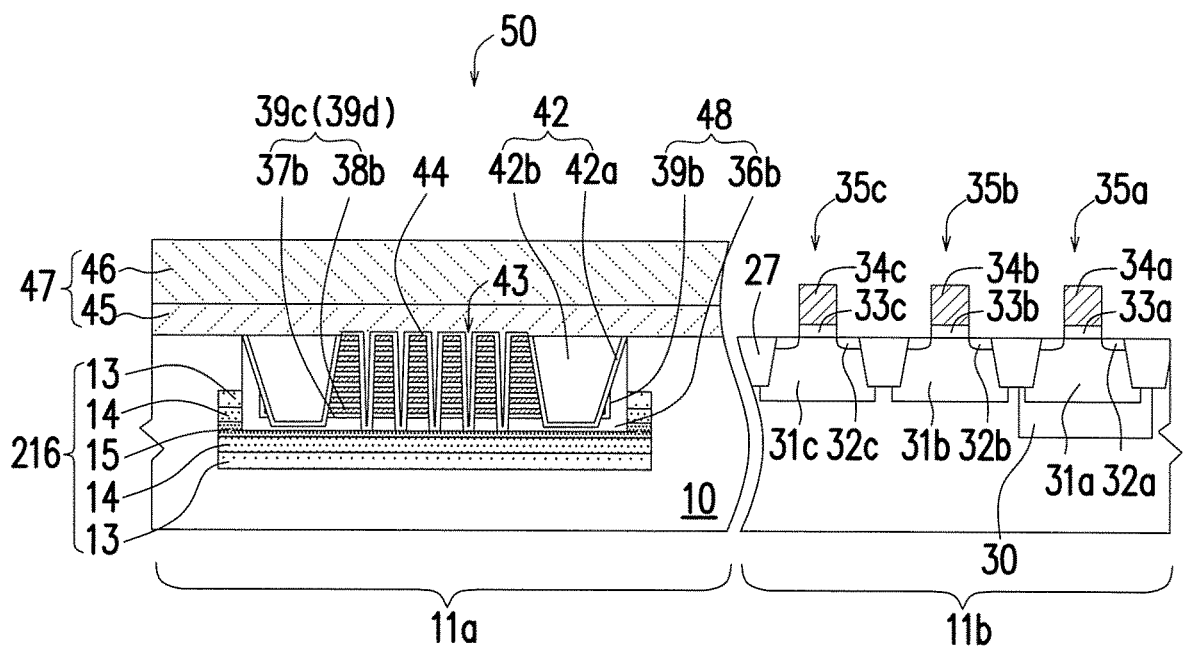

Referring to FIG. 3C to FIG. 3E, processes similar to those of the first embodiment are performed, such that a three-dimensional memory 50 is formed in the first region 11a, well regions 31a/31b/31c are formed in the second region 11b, and MOS devices 35a/35b/35c are formed in the well regions 31a/31b/31c, respectively.

In the above embodiments, the etching stop layer 16/116/216 is a single layer or a two-layer or a three-layer structure, but the invention is not limited thereto. The etching stop layer 16/116/216 may include more than three layers of the doped layer, and through adjusting the dopant concentration or doped with different dopant in each doped layer, render the doped layer in the center area (from top to bottom) of the etching stop layer has the lowest removal rate. In other words, the highest etching selectivity ratio exists between the substrate 10 and the doped layer located at the intermediate position of the etching stop layer 16/116/216.

In the second and third embodiments, since the etching stop layer 116/216 are multilayer structure and the removal rate of the doped layer in the middle is the lowest, it is possible to more preferably improve the uniformity of the removal rates of different regions in a wafer, and thus the uniformity of the depth of different deep trenches in the wafer is much improved.

FIG. 4A to FIG. 4E are schematic cross-sectional views illustrating a method of fabricating a semiconductor device according to a fourth embodiment of the invention. The present embodiment differs from the foregoing embodiment in that the dopant of the etching control layer is a removal accelerating atom, such that the removal rate of the etching control layer is higher than that of the substrate 10 during the removal process.

Figure 4A:
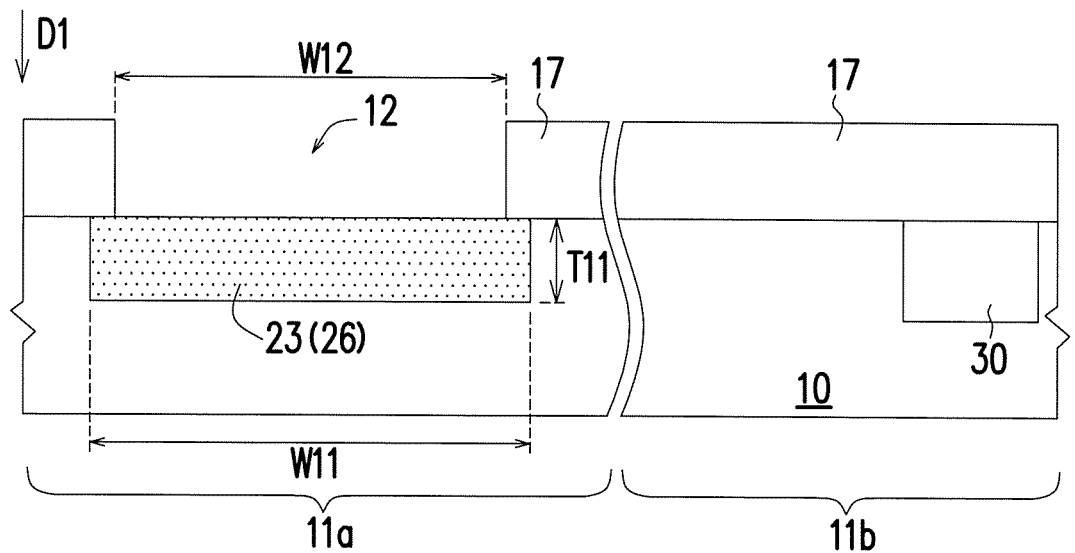
FIG. 4A to FIG. 4E are schematic cross-sectional views illustrating a method of fabricating a semiconductor device according to a fourth embodiment of the invention.

Referring to FIG. 1A and FIG. 4A, after the patterned mask layer 17 is formed on the substrate 10a shown in FIG. 1A, a doping process is performed on the substrate 10 exposed by the opening 12 to form a doped structure 26 in the substrate 10 with a patterned mask layer 17 as a mask. The doped structure 26 may be a single layer or a multilayer structure. In some embodiments, the doped structure 26 is a single layer structure including a first doped layer 23. The doping process includes an ion implantation process, an ion diffusion process or a combination thereof. The doped structure 26 serves as an etching control layer, and the dopant thereof includes a removal accelerating atom such as phosphorus atom. In some embodiments, the dopant concentration of the doped structure 26 ranges from $10^{18}$ atom/cm$^3$ to $10^{20}$ atom/cm$^3$. The removal accelerating atom means that the atom makes the removal rate of the doped structure 26 higher than that of the substrate 10 in the subsequent removal process. In some embodiments, the etching selectivity ratio of the first doped layer 23 to the substrate 10 ranges from 5:1 to 10:1.

The doped structure 26 is located in the substrate 10 below the opening 12, and the width W11 of the doped structure 26 is greater than the width W12 of the opening 12. In some embodiments, the top surface of the doped structure 26 is substantially level with the top surface of the substrate 10. In some embodiments, the thickness T11 of the doped structure 26 ranges from 0.1 μm to 3.7 μm.

Figure 4B:
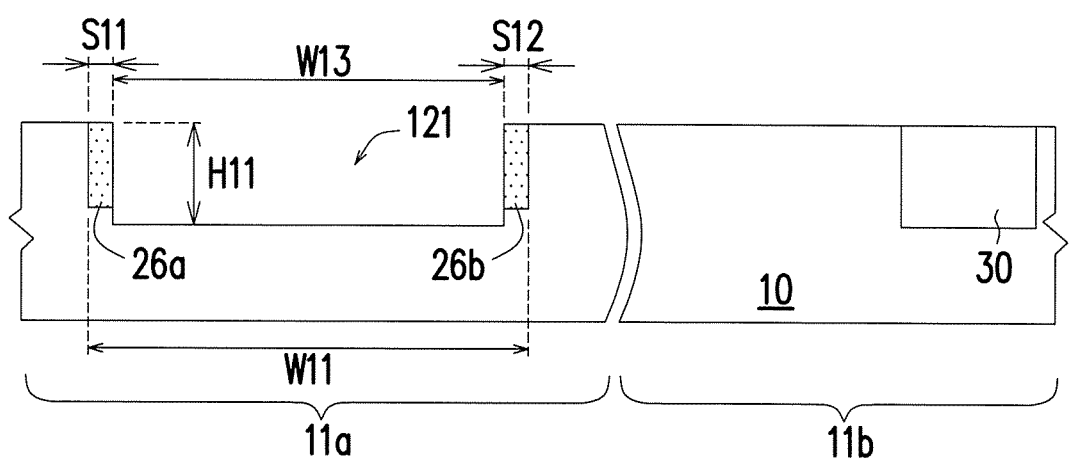

Referring to FIG. 4B, the doped structure 26 exposed by the opening 12 and a portion of the underlying substrate 10 are removed to form a trench 121 in the substrate 10 by a removal process with the patterned mask layer 17 as a mask. The patterned mask layer 17 is removed thereafter. The removal method includes an etching process such as a dry etching, a wet etching, or a combination thereof. In some embodiments in which the removal method is dry etching, the etching gas used for the etching process is, for example, $CF_4$. In some embodiments in which the removal method is wet etching, the etchant used for the etching process is KOH, for example. The removal process is performed with the one of the doped structure 26 (etching control layer) and the substrate 10 having a lower removal rate as an etching stop layer. In this embodiment, the removal process is performed with the substrate 10 located below the doped structure 26 as an etching stop layer. In some embodiments, the removal process is stopped in the substrate 10 below the doped structure 26, but the present invention is not limited thereto. In some other embodiments, the removal process may also be stopped when the substrate 10 just exposed.

Still referring to FIG. 4B, in some embodiments, the bottom of the trench 121 exposed the substrate 10, and the sidewalls of the trench 121 expose the doped structure 26. In some other embodiments, the bottom of the trench 121 exposed the substrate 10, and the sidewalls of the trench 121 expose the doped structure 26 and the substrate 10. The depth H11 of the trench 121 ranges from 1.7 μm to 3.7 μm, and the width W13 of the trench 121 ranges from 8 mm to 25 mm. The doped structure 26 after the removal process includes a first portion 26a and a second portion 26b, which are located at the two sides of the trench 121, and covers at least a portion of the sidewalls of the trench 121. The sum value (S1+S2) of the width S11 of the first portion 26a and the width S12 of the second portion 26b substantially equals to the width difference (W11−W13) value between the doped structure 26 and the trench 121.

Figure 4C:
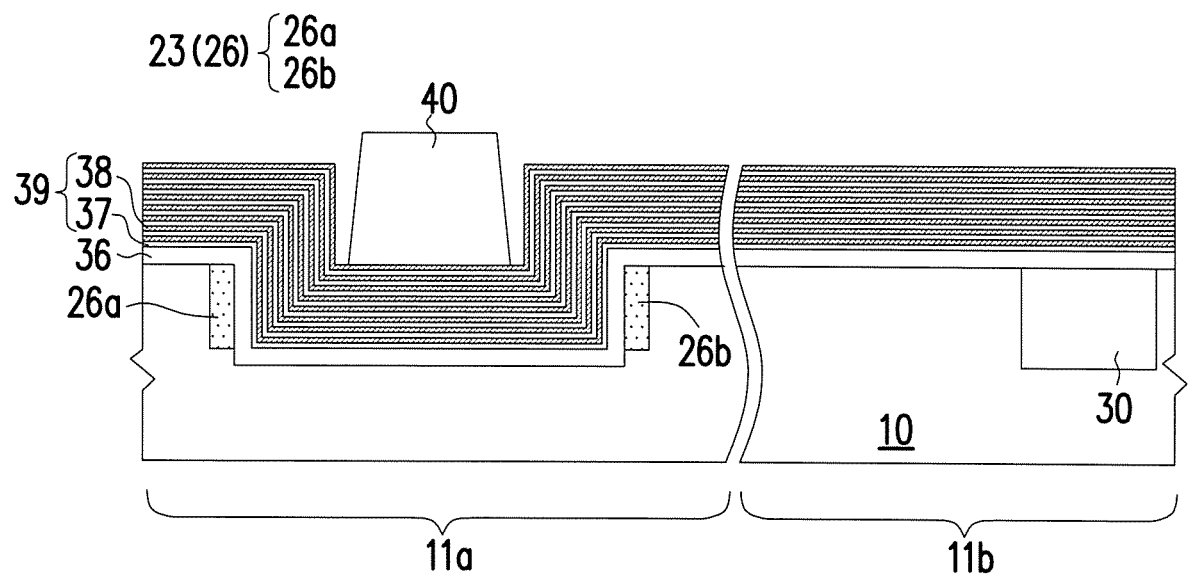
Figure 4D:
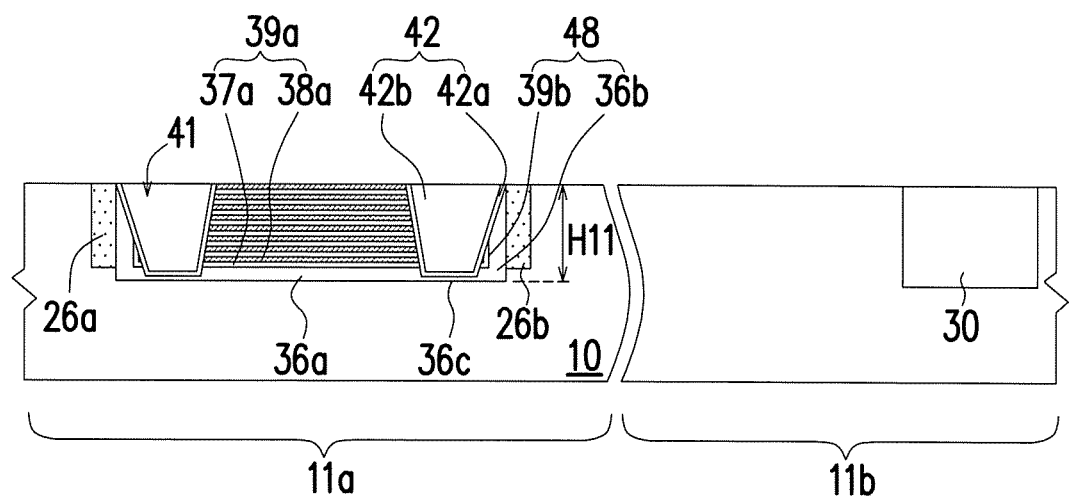
Figure 4E:
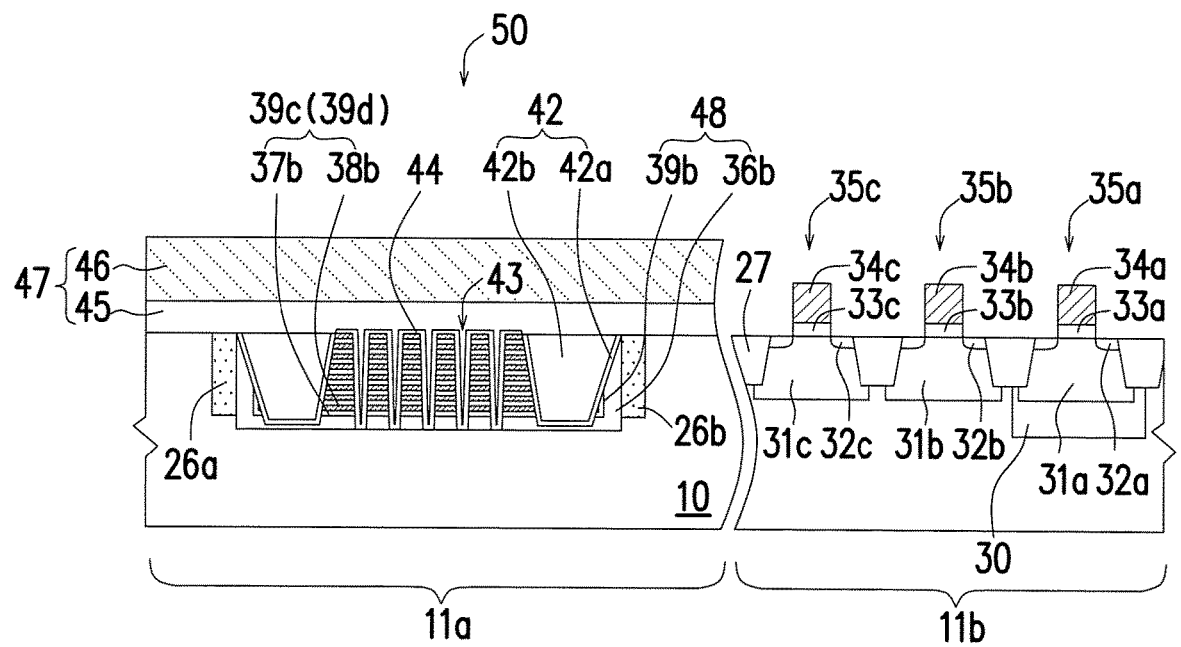

Referring to FIG. 4C to FIG. 4E, processes similar to those of the first embodiment are performed, such that a three-dimensional memory 50 is formed in the first region 11a, well regions 31a/31b/31c are formed in the second region 11b, and MOS devices 35a/35b/35c are formed in the well regions 31a/31b/31c, respectively.

FIG. 5A to FIG. 5E are schematic cross-sectional views illustrating a method of fabricating a semiconductor device according to a fifth embodiment of the invention. The present embodiment differs from the fourth embodiment in that the doped structure 126 is a multilayer structure including a first doped layer 123, a second doped layer 24, and a third doped layer 25.

Figure 5A:
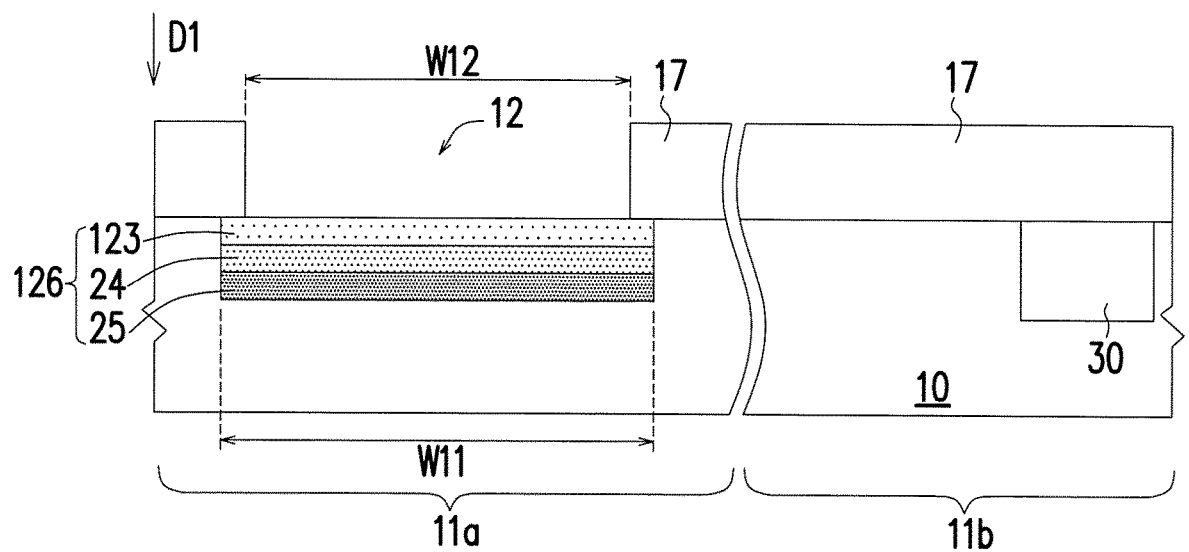
FIG. 5A to FIG. 5E are schematic cross-sectional views illustrating a method of fabricating a semiconductor device according to a fifth embodiment of the invention.

Referring to FIG. 5A, doping processes are performed on the substrate 10 exposed by the opening 12 along the first direction D1 with the patterned mask layer 17 as a mask, so as to form a first doped layer 123, a second doped layer 24 and a third doped layer 25 contacted with each other in the substrate 10. The first doped layer 123, the second doped layer 24, and the third doped layer 25 together form a doped structure 126. The top surface of the first doped layer 123 is substantially level with the top surface of the substrate 10, and has a thickness in the range of 0.1 μm to 3.7 μm. The second doped layer 24 has a thickness in the range of 0.1 μm to 3.7 μm. The third doped layer 25 has a thickness in the range of 0.1 μm to 3.7 μm. The thickness of each doped layer may be the same or different. Each of the doping process includes an ion diffusion process, an ion implantation process, or a combination thereof. Similar to the fourth embodiment, the doped structure 126 serves as an etching control layer, and the dopant thereof includes a removal accelerating atom. The dopant concentration of the doped layers 123/24/25 of the doped structure 126 is sequentially increased from top to bottom along the first direction D1. In other words, the removal rates of the first doped layer 123, the second doped layer 24, and the third doped layer 25 of the doped structure 126 in the subsequent removal process are sequentially increased.

Figure 5B:
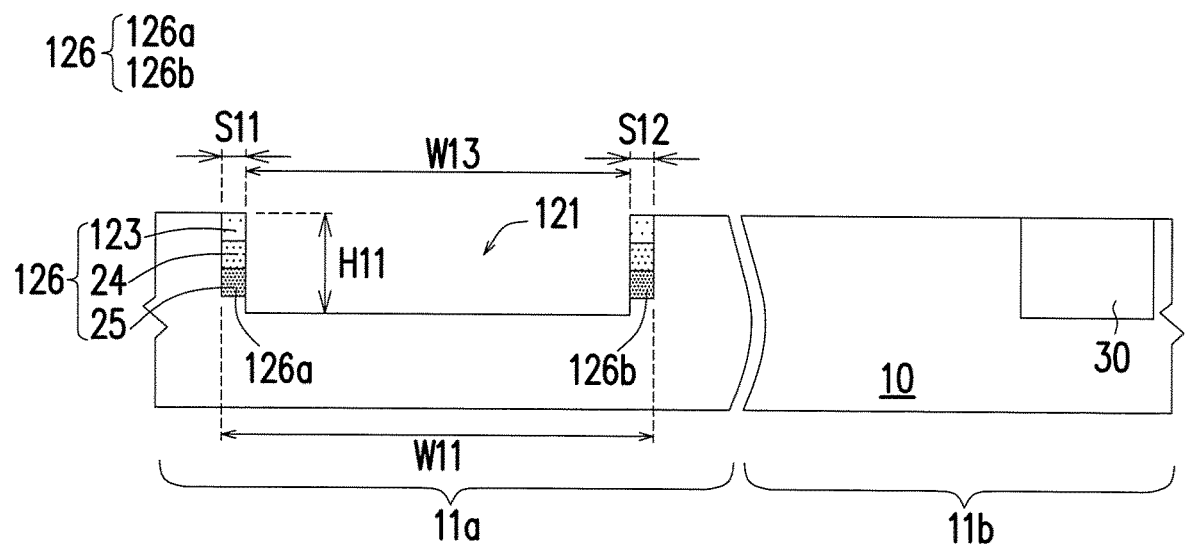

Referring to FIG. 5A and FIG. 5B, the doped structure 126 exposed by the opening 12 and a portion of the underlying substrate 10 are removed to form a trench 121 in the substrate 10 by a removal process with the patterned mask layer 17 as a mask. The patterned mask layer 17 is removed thereafter. Similar to the fourth embodiment, the substrate 10 having a lower removal rate serves as an etching stop layer in the removal process. The removal process is stopped when the substrate 10 below the dopant structure 126 is just exposed, or when a portion of the substrate 10 is removed. The doped structure 126 after the removal process includes a first portion 126a and a second portion 126b which are multilayer structures. The structural features of the trench 121 and its positional relationship with the doped structure 126 are similar to those of the fourth embodiment, which will not be described again.

Figure 5C:
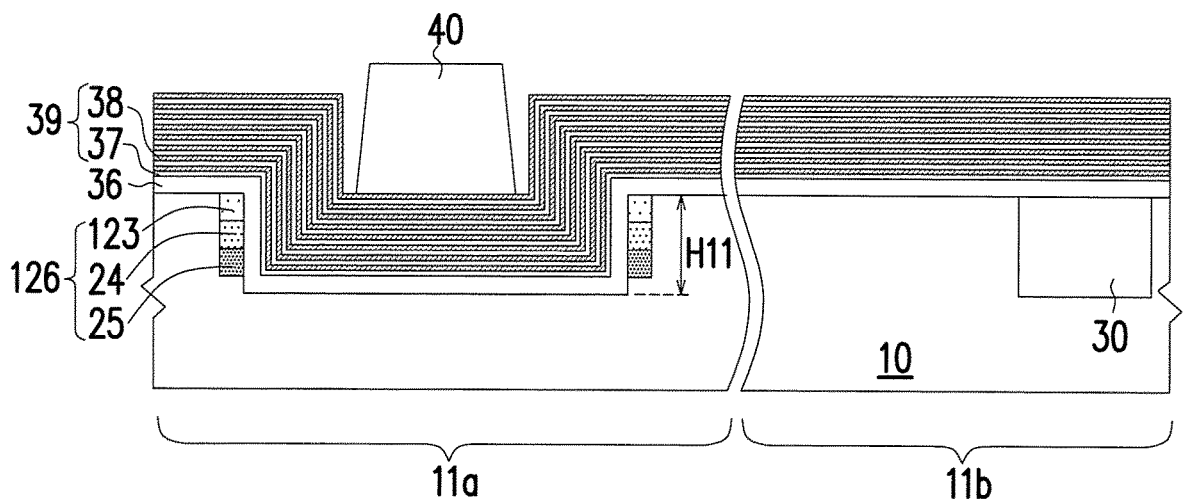
Figure 5D:
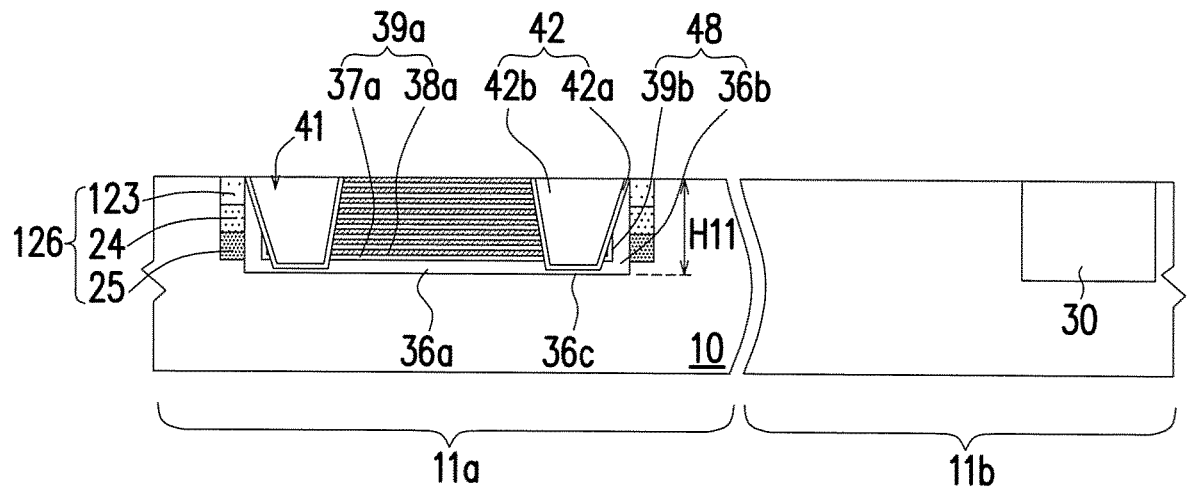
Figure 5E:
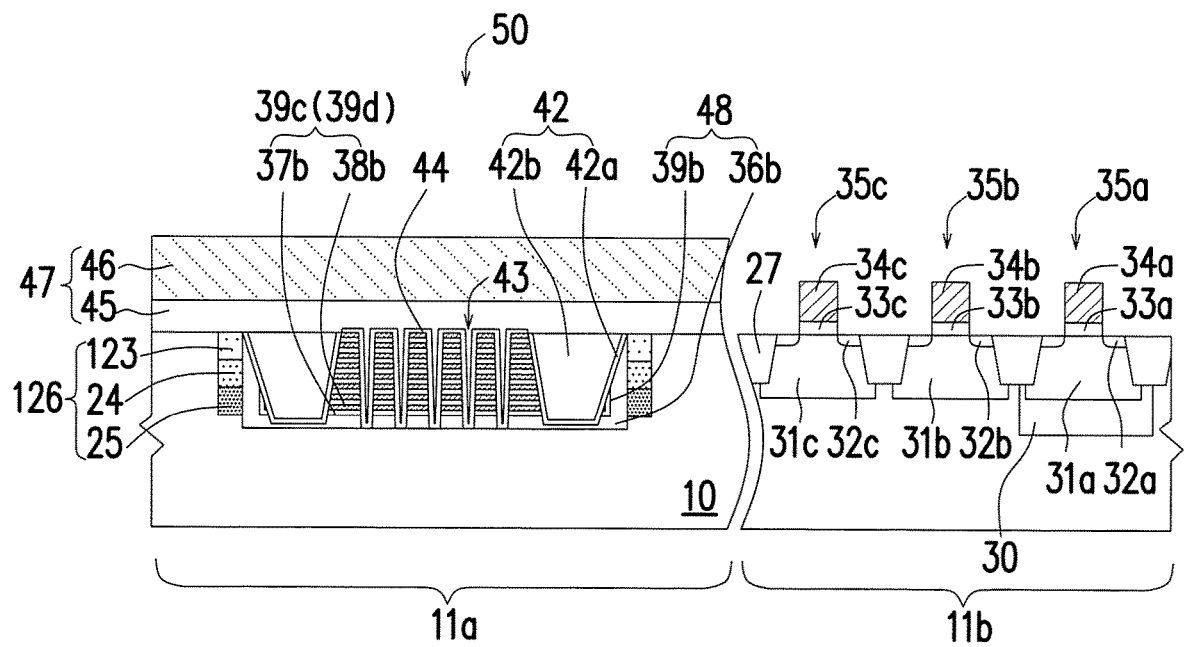

Referring to FIG. 5C to FIG. 5E, processes similar to those of the first embodiment are performed, such that a three-dimensional memory 50 is formed in the first region 11a, well regions 31a/31b/31c are formed in the second region 11b, and MOS devices 35a/35b/35c are formed in the well regions 31a/31b/31c, respectively.

The fourth and the fifth embodiment are examples in which the doped structure 26/126 is a single layer structure or a three-layer structure, but the present invention is not limited thereto. The doped structure 26/126 may be a two-layer structure or a multilayer structure having more than three layers. When the doped structure 26/126 is a multilayer structure, the dopant concentrations of the doped layers are sequentially increased from top to bottom, and the removal rates of the doped layers are thus increased sequentially. In some embodiments, the dopant concentrations of the doped layers are gradually increased from top to bottom, and the removal rates of the doped layers are thus increased gradually.

In the above embodiment, since the stacked structure 39a is formed in the trench 21/121 and the top surface thereof is substantially level with that of the substrate 10. Therefore, the depth H1/H11 of the trench 21/121 is dependent on the number of layers of the stacked structure 39a, that is, the more the number of layers of the stack structure 39a, the deeper the depth H1/H11 of the trench 21/121. It is to be noted that the distance H from the top surface of the etching stop layer 16/116/216 to the top surface of the substrate 10 and the thickness of the etching stop layer 16/116/216 and the thickness of the doped structure 26/126 all can be adjusted according to the depth H1/H11 of the trench 21/121. Furthermore, the above embodiments are examples illustrating the three dimensional memory 50 formed in the trench 21/121, but the present invention is not limited thereto. The manufacturing method using an etching control layer to control the trench uniformity and the resultant trench structure can also be applied to the processes of forming other semiconductor devices.

In summary, the uniformity of the trench depth is improved by forming an etching control layer in the substrate according to the embodiments of the present invention. In some embodiments, the uniformity is improved 90%. Specifically, an etching stop layer is formed in the substrate in the first to third embodiments. The etching stop layer formed in the substrate may reduce the removal rate difference of different regions in the wafer. That is, the loading effect of the wafer is reduced, thus the uniformity of the trenches depth is improved. In the fourth and fifth embodiments, an etching accelerating layer is formed in the substrate, which can also reduce the loading effect, such that the uniformity of the trench depth of different regions is improved.

It will be apparent to those skilled in the art that various modifications and variations can be made to the structure of the disclosure without departing from the scope or spirit of the disclosure. In view of the foregoing, it is intended that the disclosure cover modifications and variations of the disclosure provided they fall within the scope of the following claims and their equivalents.

What is claimed is:

1. A semiconductor device comprising:
a substrate having a trench; and
an etching stop layer, disposed in the substrate, surrounding and covering the bottom surface and a portion of sidewalls of the trench,
wherein the sidewalls of the trench expose a portion of the substrate,
wherein a sidewall of the substrate exposed by the trench is vertically aligned with a sidewall of the etching stop layer exposed by the trench,
wherein the etching stop layer comprises a first doped layer, and a removal rate of the first doped layer is lower than a removal rate of the substrate,
wherein the etching stop layer is a multilayer structure and further comprises a second doped layer disposed in the first doped layer, and a removal rate of the second doped layer is lower than the removal rate of the first doped layer,
wherein the second doped layer and the first doped layer comprise a same dopant, and a dopant concentration of the second doped layer is higher than a dopant concentration of the first doped layer,
wherein the etching stop layer further comprises a third doped layer disposed in the second doped layer, and a removal rate of the third doped layer is lower than the removal rate of the second doped layer.

2. The semiconductor device of claim 1, wherein the second doped layer and the first doped layer further comprise different dopants.

3. The semiconductor device of claim 1, wherein the third doped layer and the second doped layer comprise different dopants.

4. The semiconductor device of claim 1, wherein a dopant of the etching stop layer comprises boron atom, nitrogen atom, carbon atom or a combination thereof.

5. The semiconductor device of claim 1, further comprises a three dimensional memory, disposed in the trench.

6. A method of fabricating a semiconductor device, comprising:

providing a substrate;

forming an etching control layer in the substrate, wherein removal rates of the etching control layer and the substrate are different; and performing a removal process to form a trench in the substrate after the forming the etching control layer, and at least a portion of sidewalls of the trench is surrounded by the etching control layer, wherein the removal process is performed by using the etching control layer or the substrate as an etching stop layer, to at least remove a portion of the substrate located on the etching control layer, wherein the etching stop layer comprises a first doped layer, and a removal rate of the first doped layer is lower than a removal rate of the substrate, wherein the etching stop layer is a multilayer structure and further comprises a second doped layer disposed in the first doped layer, and a removal rate of the second doped layer is lower than the removal rate of the first doped layer, wherein the second doped layer and the first doped layer comprise a same dopant, and a dopant concentration of the second doped layer is higher than a dopant concentration of the first doped layer, wherein the etching stop layer further comprises a third doped layer disposed in the second doped layer, and a removal rate of the third doped layer is lower than the removal rate of the second doped layer.

7. The method of fabricating the semiconductor device of claim 6, wherein the forming the etching control layer comprises forming the first doped layer in the substrate by implanting a dopant into the substrate, so that the removal rate of the first doped layer is lower than the removal rate of the substrate.

8. The method of fabricating the semiconductor device of claim 6, wherein the second doped layer and the first doped layer are formed by implanting the same dopant.

9. The method of fabricating the semiconductor device of claim 8, wherein the third doped layer is formed by implanting a dopant different from the second doped layer.

10. The method of fabricating the semiconductor device of claim 6, wherein forming the second doped layer and the first doped layer further comprises implanting different dopants.

* * * * *